United States Patent
Stern et al.

(10) Patent No.: US 7,814,263 B2
(45) Date of Patent: Oct. 12, 2010

(54) ERASE HISTORY-BASED FLASH WRITING METHOD

(75) Inventors: Ori Stern, Modiin (IL); Amir Mosek, Tel Aviv (IL)

(73) Assignee: SanDisk IL Ltd., Kfar Saba (IL)

( * ) Notice: Subject to any disclaimer, the term of this patent is extended or adjusted under 35 U.S.C. 154(b) by 741 days.

(21) Appl. No.: 11/727,986

(22) Filed: Mar. 29, 2007

(65) Prior Publication Data
US 2008/0104310 A1 May 1, 2008

Related U.S. Application Data

(60) Provisional application No. 60/862,987, filed on Oct. 26, 2006.

(51) Int. Cl.
*G06F 12/00* (2006.01)
(52) U.S. Cl. ................ 711/103; 711/156; 711/E12.078
(58) Field of Classification Search ........................ None
See application file for complete search history.

(56) References Cited

U.S. PATENT DOCUMENTS

| 5,404,485 | A | 4/1995 | Ban |
| 5,937,425 | A | 8/1999 | Ban |
| 6,148,354 | A | 11/2000 | Ban et al. |
| 6,988,175 | B2 | 1/2006 | Lasser |
| 2004/0246779 | A1 * | 12/2004 | Honda et al. ........... 365/185.08 |

* cited by examiner

*Primary Examiner*—Shawn X Gu
(74) *Attorney, Agent, or Firm*—Martine Penilla & Gencarella, LLP (57) ABSTRACT

A method for writing into a flash memory device includes calculating a physical block for writing data thereto, checking whether the calculated physical block has been erased since a last power-up of the device and if it has been erased writing the data, or, if it has not been erased performing a refresh operation thereby obtaining a newly erased block since a last power-up that the data can be written to. The newly erased block may be the calculated block or another block of the flash memory.

21 Claims, 7 Drawing Sheets

ERASE HISTORY-BASED FLASH WRITING METHOD

CROSS REFERENCE TO RELATED APPLICATIONS

The present invention claims priority from U.S. Provisional Patent Application No. 60/862,987 filed 26 Oct. 2006, the contents of which are incorporated herein by reference.

FIELD OF THE INVENTION

The present invention relates in general to data storage devices and methods and in particular to methods of writing data to pages in flash memories.

DEFINITION OF TERMS

The following definitions are used throughout this specification

Non-volatile memory (NVM)—Memory that stores data insensitive to power being switched on and off.

Volatile memory—Memory that stores data that is changed or influenced by power off.

Physical Block—The minimum erasable unit in flash memory. Flash protocol does not provide any command for erasing data of a length smaller than a block, and which is not aligned to a block size. A block consists of pages.

Logical Block: A block of data stored in a memory device, and associated with an address ("logical block address" or LBA) for purposes of retrieval or overwriting. The term logical block is typically used to refer to the host's view of data addressing on a physical device. Within a storage device, there is often a further conversion between the logical blocks presented to hosts and the physical media locations at which the corresponding data is stored.

Page—The minimum readable and writable unit in NAND flash memory. There are multiple pages in a block.

Flash memory—A reprogrammable non-volatile memory. Flash memory can be erased, written and read.

Valid data—Data that was not superseded by newer data overriding it.

BACKGROUND OF THE INVENTION

Figure 1A:
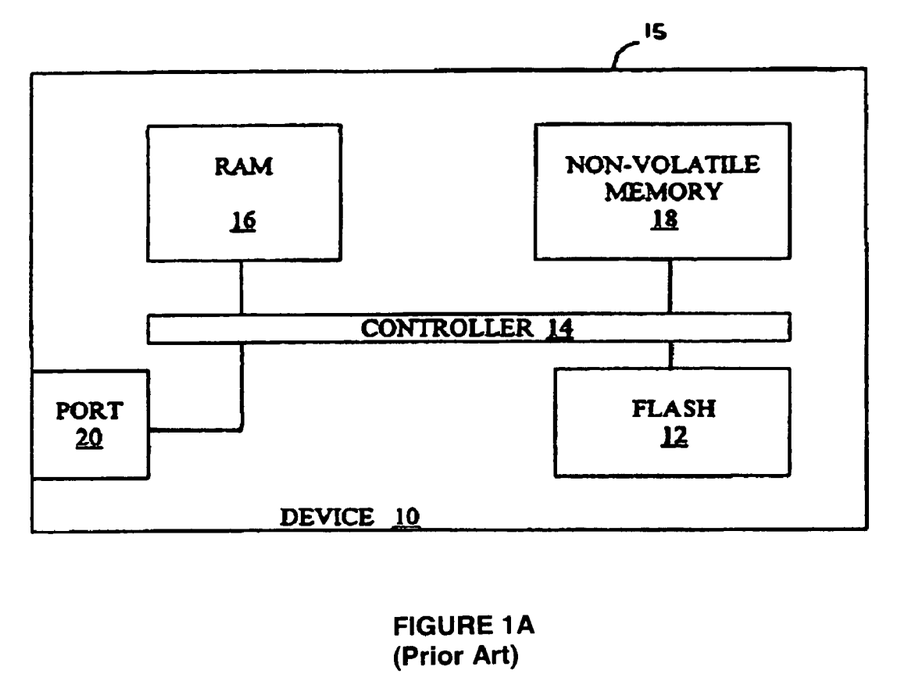
FIGS. 1a and 1b are high level schematic block diagrams of prior art devices that use NAND flash media for non volatile data storage.

Flash memory devices are well known in the art, see for example U.S. Pat. No. 6,988,175 to Lasser, which is incorporated herein by reference. FIG. 1A is a high level schematic block diagram of a generic, prior art flash-based data storage device 10 shown therein. Device 10 is used by a host device (not shown) for storing data in one or more NAND flash media 12. The operation of device 10 is controlled by a microprocessor-based controller 14 with the help of a random access memory (RAM) 16 and an auxiliary non-volatile memory 18. For this purpose, flash device 10 and the host system communicate via a communication port 20 in flash device 10. Typically, for backwards compatibility with host devices whose operating systems are oriented towards block memory devices such as magnetic hard disks, flash device 10 emulates a block memory device, using firmware stored in auxiliary non-volatile memory 18 that implements flash management methods such as those taught by Ban in U.S. Pat. Nos. 5,404,485 and 5,937,425, both of which patents are incorporated by reference for all purposes as if fully set forth herein. The components of device 10 are housed together in a common housing 15.

Figure 1B:
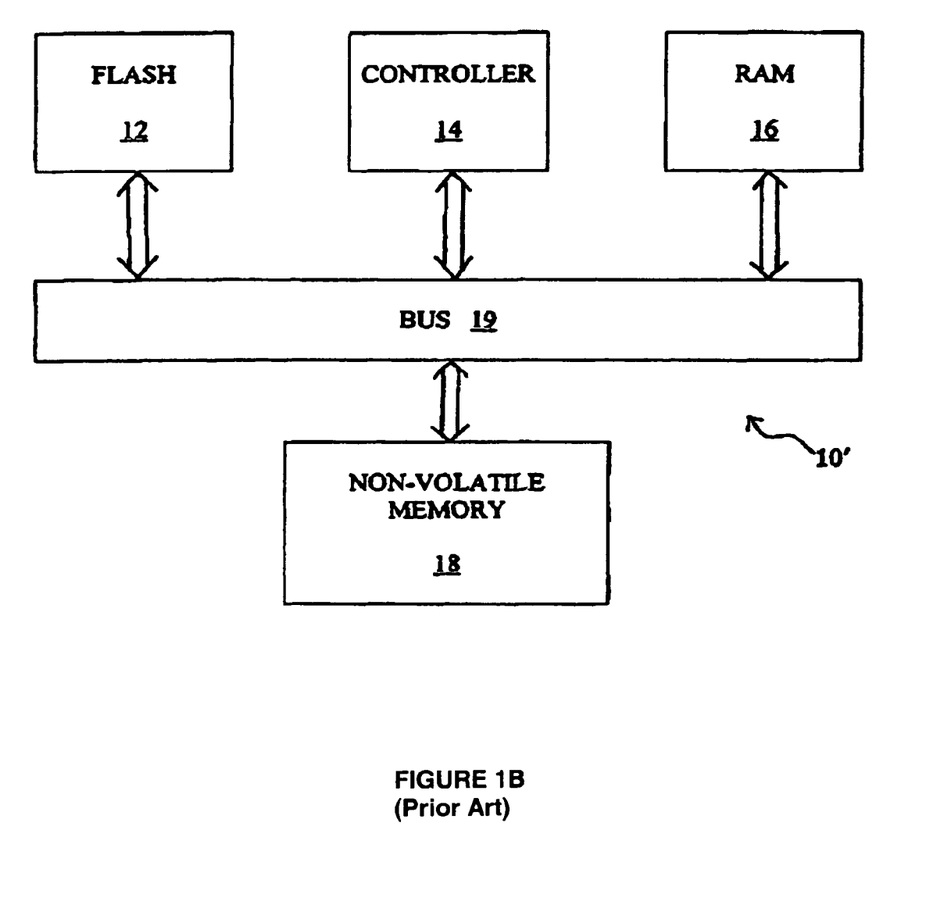

Other devices that use NAND flash media to store data are known. FIG. 1B, also taken from U.S. Pat. No. 6,988,175, shows such a prior art device, a personal computer 10' in which NAND flash media 12 are used in addition to, or as a substitute for, a magnetic hard disk for long-term non-volatile data storage. Controller 14 now represents the central processing unit of personal computer 10'. Auxiliary non-volatile memory 18 now represents all of the other non-volatile memories of personal computer 10', including a BIOS in which boot code is stored and a magnetic hard disk for storing the operating system, including the flash management system, of personal computer 10' (unless NAND flash media 12 are a substitute for a magnetic hard disk, in which case the operating system is stored in NAND flash media 12). NAND flash media 12, controller 14, RAM 16, auxiliary non-volatile memory 18 and other components (not shown) of personal computer 10' communicate with each other via a bus 19. In some configurations of personal computer 10', NAND flash media 12 are on a removable card. In other configurations of personal computer 10', the illustrated components are integrated in a single unitary physical device, so that NAND flash media 12 are not a physically separate entity.

The operations that controller 14 performs on NAND flash media 12 include read operations, write operations and erase operations. NAND Flash media 12 typically are written in units called "pages", each of which typically includes between 512 bytes and 2048 bytes, and typically are erased in units called "blocks", each of which typically includes between 16 and 64 pages. Note that the use of the word "block" to refer to the erasable units of NAND flash media 12 should not be confused with the use of the word "block" in the term "block memory device". The "block" nature of a block memory device refers to the fact that the device driver exports an interface that exchanges data only in units that are integral multiples of a fixed-size unit that typically is called a "sector".

To facilitate the management of NAND flash media 12, controller 14 assigns each page a status of "unwritten" or "written". A page whose status is "unwritten" is a page that has not been written since the last time it was erased, and so is available for writing. A page whose status is "written" is a page to which data have been written and not yet erased. In some embodiments of device 10, controller 14 also assigns some pages a status of "deleted". A page whose status is "deleted" is a page that contains invalid (typically superseded or out of date) data. In embodiments of device 10 that support "deleted" pages, the "written" status is reserved for pages that contain valid data. A page whose status is "unwritten" is called an "unwritten page", a page whose status is "written" is called a "written page" and a page whose status is "deleted" is called a "deleted page".

Because device 10 is used for non-volatile data storage, it is vital that device 10 retain the data written thereto under all circumstances. A major risk to the integrity of data stored in device 10 is a sudden power failure in which the power source to device 10 is interrupted with no prior notice while device 10 is in the middle of an operation. Often such a power failure causes the interrupted operation to have erratic or unpredictable results.

The problem of data loss in flash memory systems due to power interruption is well known in the art of non-volatile memory systems, and described in detail in U.S. Pat. No. 6,988,175. Write operations can be interrupted by power loss before the logical state of a cell has changed from "1" to "0", resulting in pages defined herein as "interrupted" pages.

Although interrupted pages may seem ready to be written, as they have not been written since the last time their block was erased, in actuality, some of their cells are "almost turned to logical 0". In flash memory, following such an event, the stored data in such pages is not only unpredictable but also unreliable, as an interrupted write operation leaves the data in a non-stable state. The logical state may seem correct, but if cells that are supposed to be "0" are already written with electrons from the interrupted write operation, the logical state may change spontaneously over time. The following example shows how an interrupted write process can cause a problem.

If a sequence of bits are properly erased, their content will be

1111111111111111111111

Now, if the data

11001000111010101000101

Is written to this area, the sequence would become:

11001000111010101000101

But if the write process is interrupted before the cells have changed their logical state, the area will remain:

1111111111111111111111

However, the pale digits may be partially in transition, and there is no way to know that by reading the data.

Now, if the following new data is written to this area:

10101001001110101110101

The result will be:

10101010001110101110101 meaning that all the pale "1"'s are partially converted to "0" and may unintentionally change their logical state. For this reason, it is essential that data never be written into an interrupted page.

One prior art method for such assuring that data is not written to an interrupted page is to always read the page to be written and compare its content to the value "111 . . . 1", which is the expected readout of an erased page. As explained above, this is not a reliable method, as a page may be poorly written due an interrupted process.

Another prior art method for such assurance is to always write only into fresh blocks. In other words, whenever moving to write in a different block, one starts with a fully erased block. If one fills only half of a block and moves elsewhere, one is not allowed to return to the half empty block and continue where previously stopped. A new erased block is allocated, any previous data from the previous block is moved into the new block and the new data is then written therein. This solves the problem, but is very inefficient.

There is therefore a widely recognized need for, and it would be highly advantageous to have a method for writing into a flash memory device that ensures that data is written only to a page that has not been interrupted in writing, without the poor reliability or inefficiency of the prior art methods.

SUMMARY OF THE INVENTION

The invention discloses methods for writing into a flash memory device wherein it is assured that data is written into a physical block of the flash memory device only if the physical block has been erased since the last power-up. The term "refreshing" refers to a process performed on a logical block in order to re-arrange the valid data of the logical block, data which is scattered in all the physical blocks that are mapped to the logical block, while preserving the logical block content. During refreshing, physical blocks are re-assigned to the refreshed logical block and the data of the logical block is re-arranged in the re-assigned physical blocks. In a refreshing process, there may be instances in which more than one physical block becomes erased, see below in the Detailed Description section.

As used in the present invention, "cleansed" specifically refers to a binary property of a physical block in a flash device, indicating that the physical block has been erased since the last power-up. In other words, as used herein, the term "cleansed" specifically means "erased since last power-up". A not-cleansed block is a physical block that has not been erased since the last power-up. A "cleansed page" is a page that belongs to a cleansed block.

Note that the term "refreshing" applies both to cases where there is valid data and to cases where there is no valid data in the logical block. The refreshing may be periodic. "Periodic" refreshing refers to any recurring sequence of refreshing operations and not only to equal intervals between successive refreshing.

According to the present invention there is provided a method for writing into a flash memory device including the steps of receiving data to be written into the device, calculating a physical block for writing the data thereto, obtaining an indication whether the calculated physical block has been erased since a last power-up of the device, and if the indication is that the calculated physical block has been erased since the last power-up, writing the data into the calculated physical block, or, if the indication is that the calculated physical block has not been erased since last power-up, obtaining a physical block that was erased since last power-up and writing the data into the physical block that was erased since last power-up.

According to the present invention there is provided a memory device for storing data, comprising a flash memory that includes a plurality of physical blocks and a controller operative to calculate a physical block for writing data thereto, obtain an indication whether the calculated physical block has been erased since a last power-up of the device and: if the indication is that the calculated physical block has been erased since the last power-up, write the data into the calculated physical block, or, if the indication is that the calculated physical block has not been erased since last power-up, obtain a physical block that was erased since last power-up and write the data into the physical block that was erased since last power-up.

According to the present invention there is provided a system for storing data, comprising a memory device that includes a flash memory having a plurality of physical blocks and a processor operative to calculate a physical block for writing data thereto, obtain an indication whether the calculated physical block has been erased since a last power-up of the device and: if the indication is that the calculated physical block has been erased since the last power-up, write the data into the calculated physical block, or, if the indication is that the calculated physical block has not been erased since last power-up, obtain a physical block that was erased since last power-up and write the data into the physical block that was erased since last power-up.

According to the present invention there is provided a computer readable storage medium having computer readable code embodied thereon, the computer readable code for managing a flash memory having a plurality of physical blocks, the computer readable code including: a) program code for calculating a physical block for writing data thereto, b) program code for obtaining an indication whether the calculated physical block has been erased since a last power-up of the device, and, if the indication is that the calculated physical block has been erased since the last power-up, c) program code for writing the data into the calculated physical block, or, if the indication is that the calculated physical block has not been erased since last power-up, d) program code for obtaining a physical block that was erased since last power-up and for writing the data into the physical block that was erased since last power-up.

BRIEF DESCRIPTION OF THE DRAWINGS

The invention is herein described, by way of example only, with reference to the accompanying drawings, wherein.

DETAILED DESCRIPTION OF THE INVENTION

As mentioned above, the invention discloses a method for writing into a flash memory device that assures that data is written only to physical blocks that have been erased since the last power-up (cleansed physical blocks). The method can also be viewed as a flash memory management method that ensures writing of data only to cleansed physical blocks.

Figure 2:
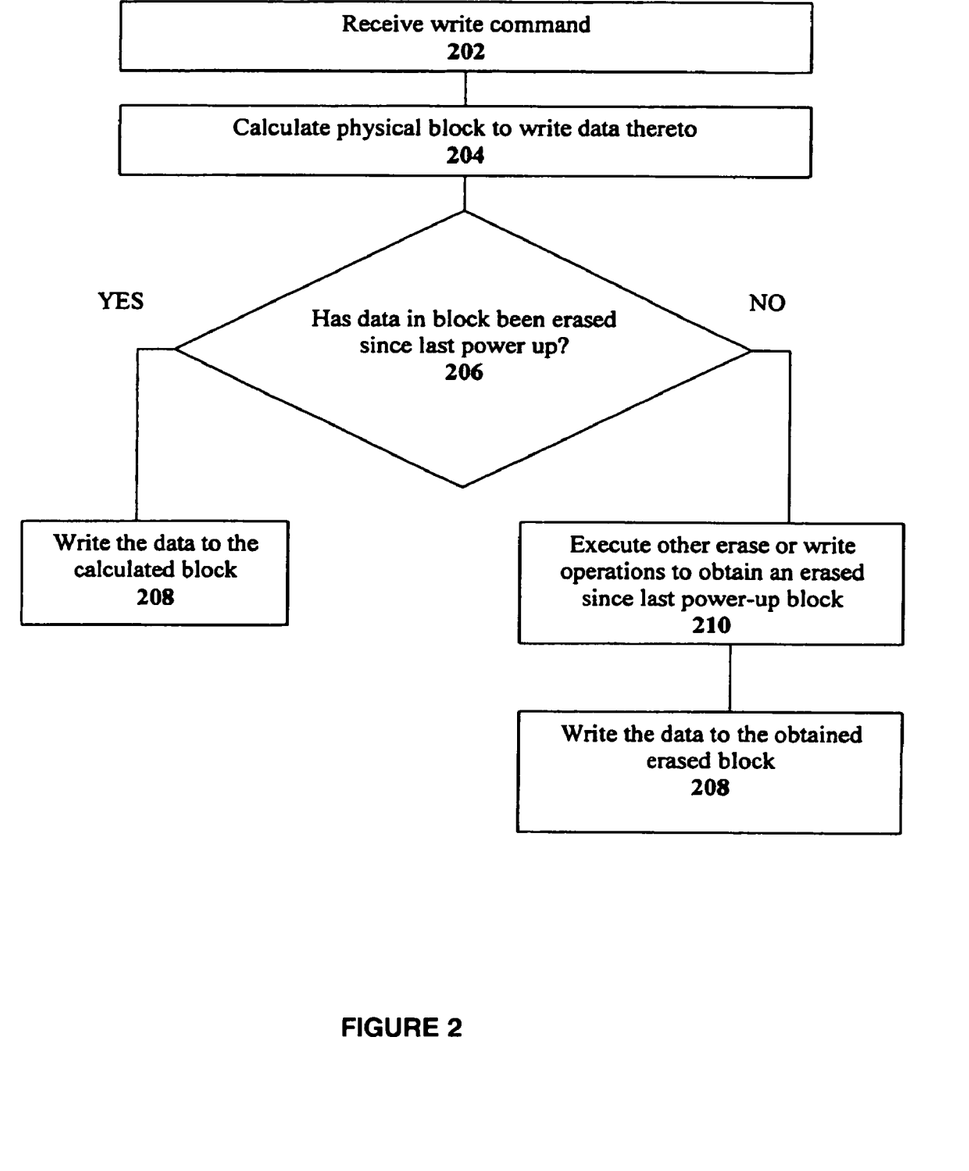
FIG. 2 shows the main steps of the method of the present invention.

FIG. 2 shows the main steps of the method of the present invention. A data write request or "command" to write into a logical block Z is received by a controller of the device (see FIGS. 5a, b below) in step 202. The flash management algorithm (software) implemented in the controller calculates a physical block Y that is currently mapped to logical block Z for writing the data thereto in step 204 and obtains an indication whether the calculated physical block has been erased since a last power-up of the device in step 206. If the indication is YES (the calculated physical block has been erased since the last power-up), the algorithm write the data to the calculated physical block (Y) in step 208. If the indication is NO (the calculated physical block has not been erased since last power-up), the algorithm executes other erase or write operations (see example below) in step 210 and, subsequently, writes the data to a physical block erased since last power-up (e.g. a block X) in step 214.

As an example of a process that includes the "other erase or write operations", mentioned above, assume that upon a write request into a logical block Z in step 202, the flash management algorithm tries in step 204 to allocate a free page that belongs to a physical block Y (which is mapped to logical block Z) in order to write into it. If physical block Y is found not to be cleansed (i.e. the indication is step 206 above is NO), the flash management algorithm refreshes logical block Z, i.e. erases an available (without any valid data) physical block X (which may be taken from a pool of free and unused physical blocks), copies all valid data from physical block Y to physical block X, writes the new data (step 210 above) to physical block X, and then erases physical block Y. As blocks X and Y are erased during this refreshing process, they will not need to be erased again before being written to—as long as the power remains on. In this example, the refreshing mechanism turned two physical blocks, X and Y, into blocks that can be written to, as a result of refreshing logical block Z.

Two embodiments of the method, each including different additional sub-steps, are described in more detail below. In either embodiment, the method includes obtaining the indication above from an entry in a dedicated table, which is preferably located in a random access memory of the device. This table is named herein "Cleansed Physical Blocks (CPB) Table" and is marked by numeral 522 in FIGS. 5a, b. For simplicity, it is referred to hereinafter simply as "Table 522". Each physical block is represented in Table 522, by a respective table entry. In either embodiment of the method, Table 522 is reset to a uniform value of "not-cleansed" upon power-up. This means there is no need to store it in the NVM, as its initial value after power-up is known. The volatile part of the memory is indifferent to process of erasing since last power-up, and Table 522 stored therein can be safely used to monitor the process of refreshing.

Figure 3:
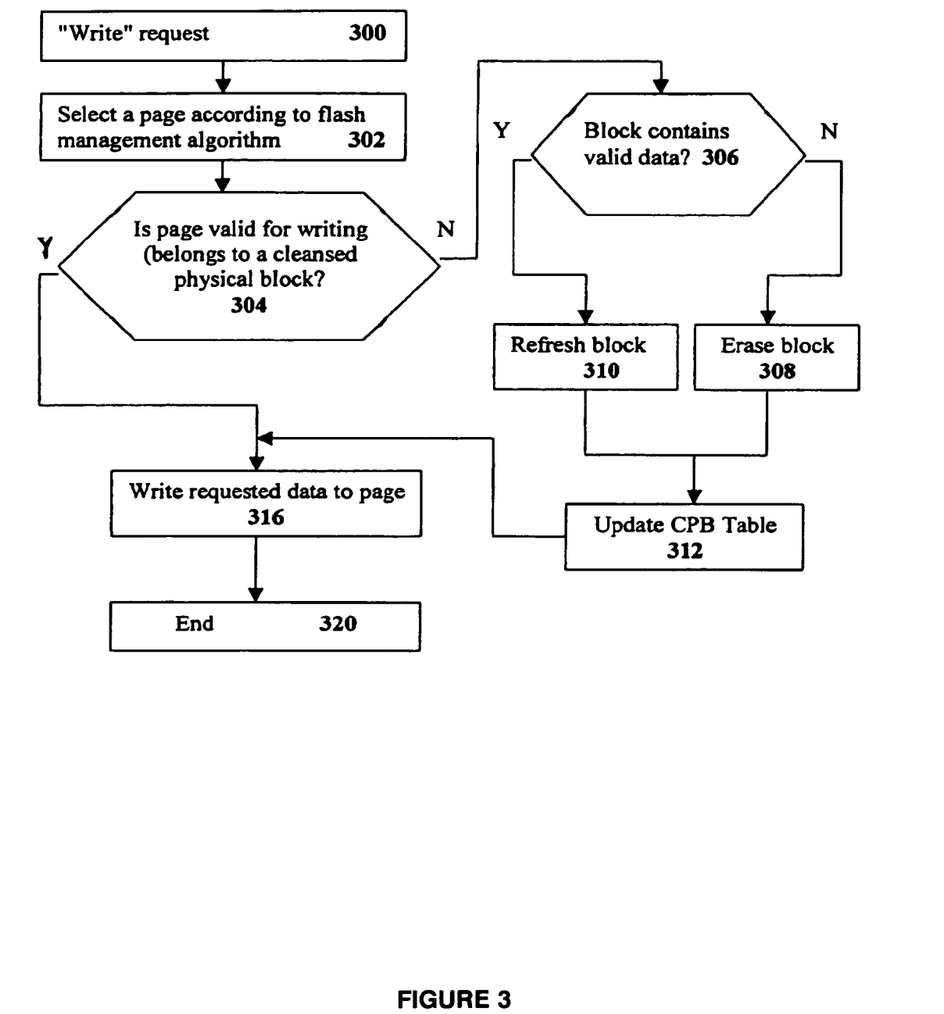
FIG. 3 shows a first embodiment of a method for writing into a flash memory device according to the present invention.

FIG. 3 shows a detailed flow chart of the first embodiment of the method, referred to as a "refresh-on-demand" embodiment. Upon a write request detected in step 300, the flash management algorithm calculates (selects) the address of an available page of a respective physical block into which data should be written in step 302 and checks in step 304 if the page is cleansed. The check includes checking if a relevant entry in Table 522 indicates that the respective physical block to which the selected page belongs is cleansed. If YES (the calculated physical block is cleansed, i.e. erased since the last power-up), the data is written to the page in step 316 and the operation ends in step 320. If NO (the calculated physical block is not cleansed, i.e. not erased since last power-up), the flash management algorithm checks if there is at least one valid page in the corresponding (to the non-cleansed physical block) logical block in step 306.

If at least one valid page is found in step 306 (YES), the flash management algorithm refreshes the corresponding logical block in step 310. The refreshing includes the "other erase or write operations" described in step 210 above. That is, the flash management algorithm looks for a new available physical block, erases this new available physical block, and updates Table 522 to show that the new available physical block is cleansed. It then copies the pages that contain valid data from the old (calculated not-cleansed) physical block into the new erased block. Eventually, the flash management algorithm writes the requested data to an available page in the new erased physical block.

If no valid page is found in step 310 (NO), the flash management algorithm erases the non-cleansed physical block in step 308. In step 312, the flash management algorithm updates Table 522 with all physical blocks cleansed during refreshing step 310 or erasing step 308. The flash management algorithm then writes the data into a block that is known to be cleansed in step 316, and the process ends in step 320.

Figure 4:
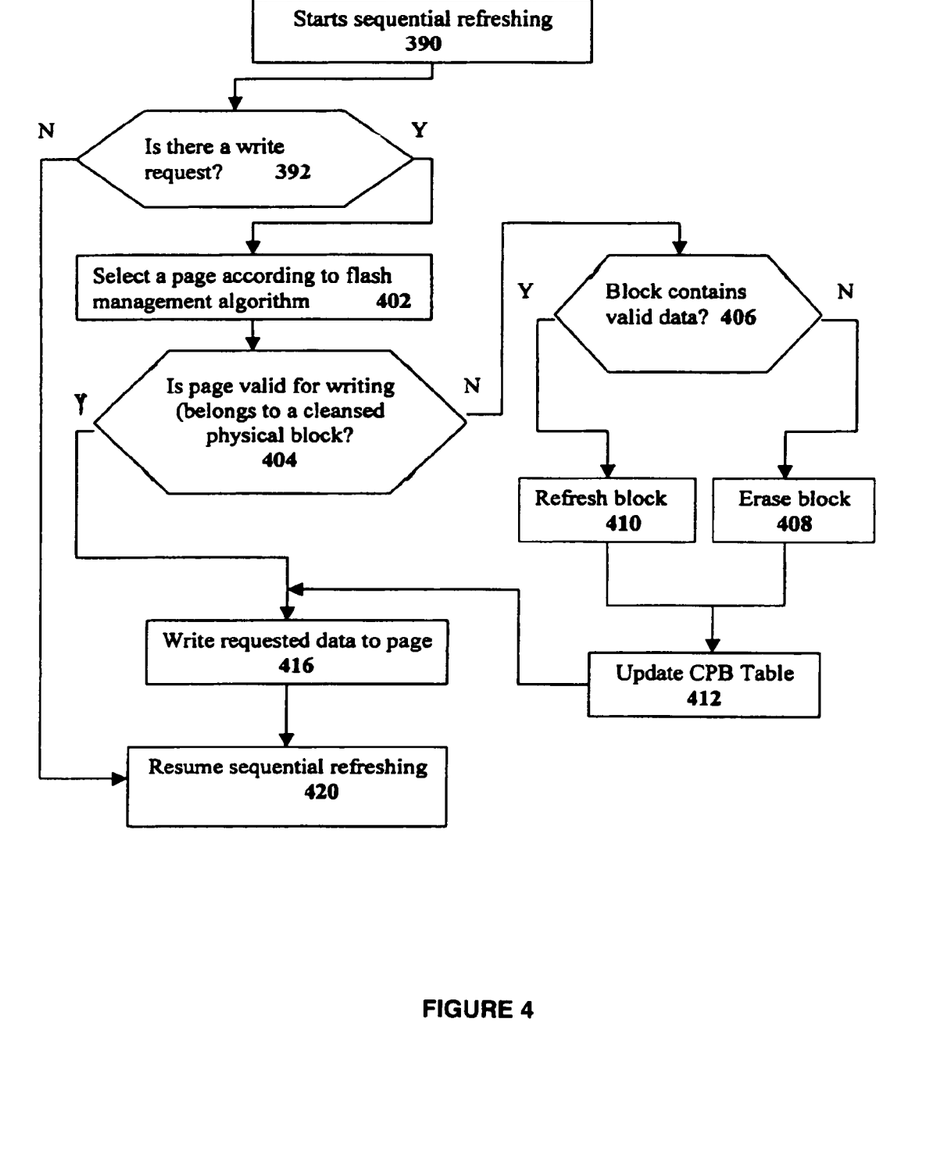
FIG. 4 shows a second embodiment of a method for writing into a flash memory device according to the present invention.

FIG. 4 shows a detailed flow chart of the second embodiment of the method, referred to as a "pro-active refreshing" embodiment. Pro-active refreshing refers to the action of the flash management algorithm starting, upon power up, a sequential logical block refreshing process in step 390. By "sequential", we mean refreshing of all logical blocks allocated for write operations according to their logical address. When the flash management algorithm completes refreshing a logical block, it increments a "Last Refreshed Block Pointer" to the next logical block, updates Table 522 and moves to the next logical block. This process ends when the pointer points to the last logical block in the flash memory that can be written into, when all entries in the table indicate "cleansed", or when the flash device is powered off. Upon a write request detected in step 392, the flash management algorithm calculates the address of an available page of a respective physical block into which data should be written in step 402 and checks in step 404 if a relevant entry in Table 522 indicates that the respective physical block is cleansed. If YES (the calculated physical block is cleansed, i.e. erased since the last power-up), the data is written to the page in step 416 and the sequential refreshing resumes in step 420. If NO (the calculated physical block is not cleansed, i.e. not erased since last power-up), the flash management algorithm checks if there is at least one valid page in the corresponding logical block in step 406.

If at least one valid page is found (YES), the flash management algorithm refreshes the respective logical block in step 410. The refreshing may include erase or write operations as described in detail above for step 310. If no valid page is found (NO), the flash management algorithm erases the physical block in step 408.

If no valid page is found in step 406, the flash management algorithm erases the non-cleansed physical block in step 408. In step 412, the flash management algorithm updates Table 522 with all physical blocks cleansed during refreshing step 410 or erasing step 408. The flash management algorithm then writes the data into a block that is known to be cleansed in step 416, and resumes the sequential refreshing in step 420.

Figure 5A:
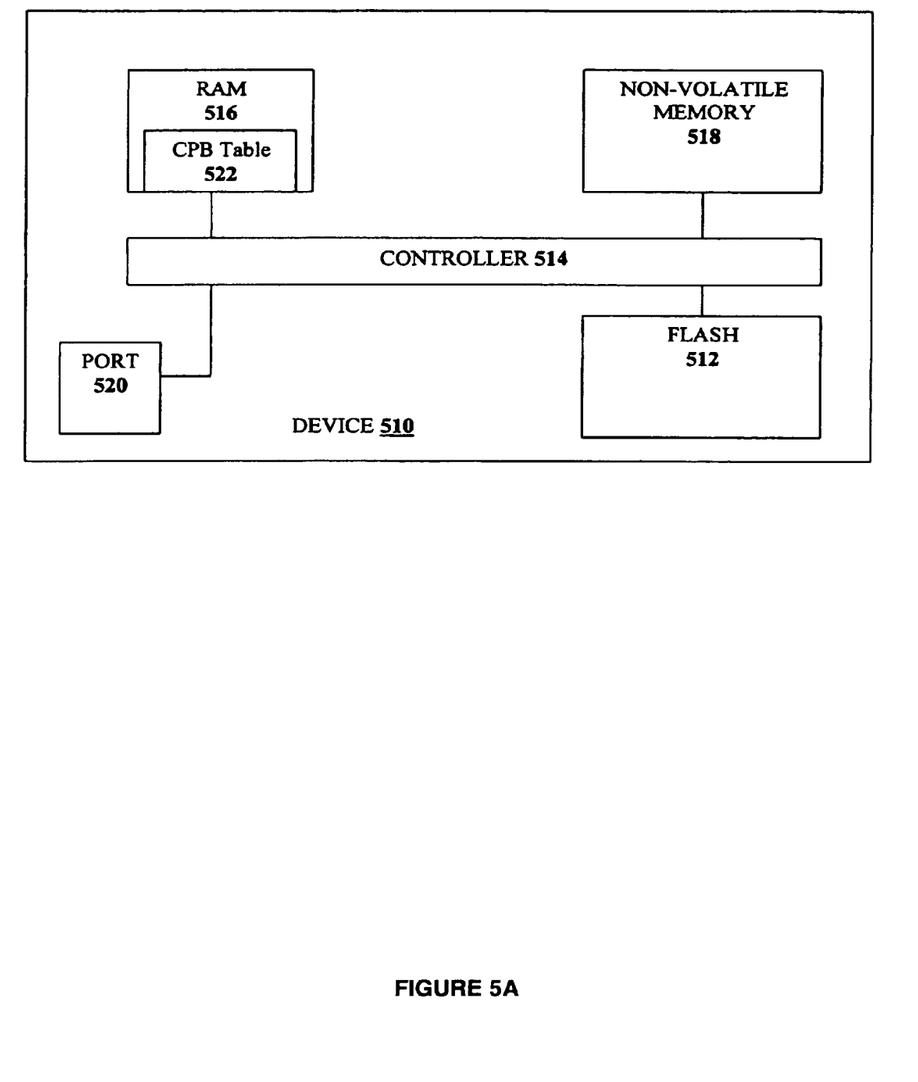
FIGS. 5a and 5b are high level schematic block diagrams of the devices of FIGS. 1a and 1b as modified according to the present invention.
Figure 5B:
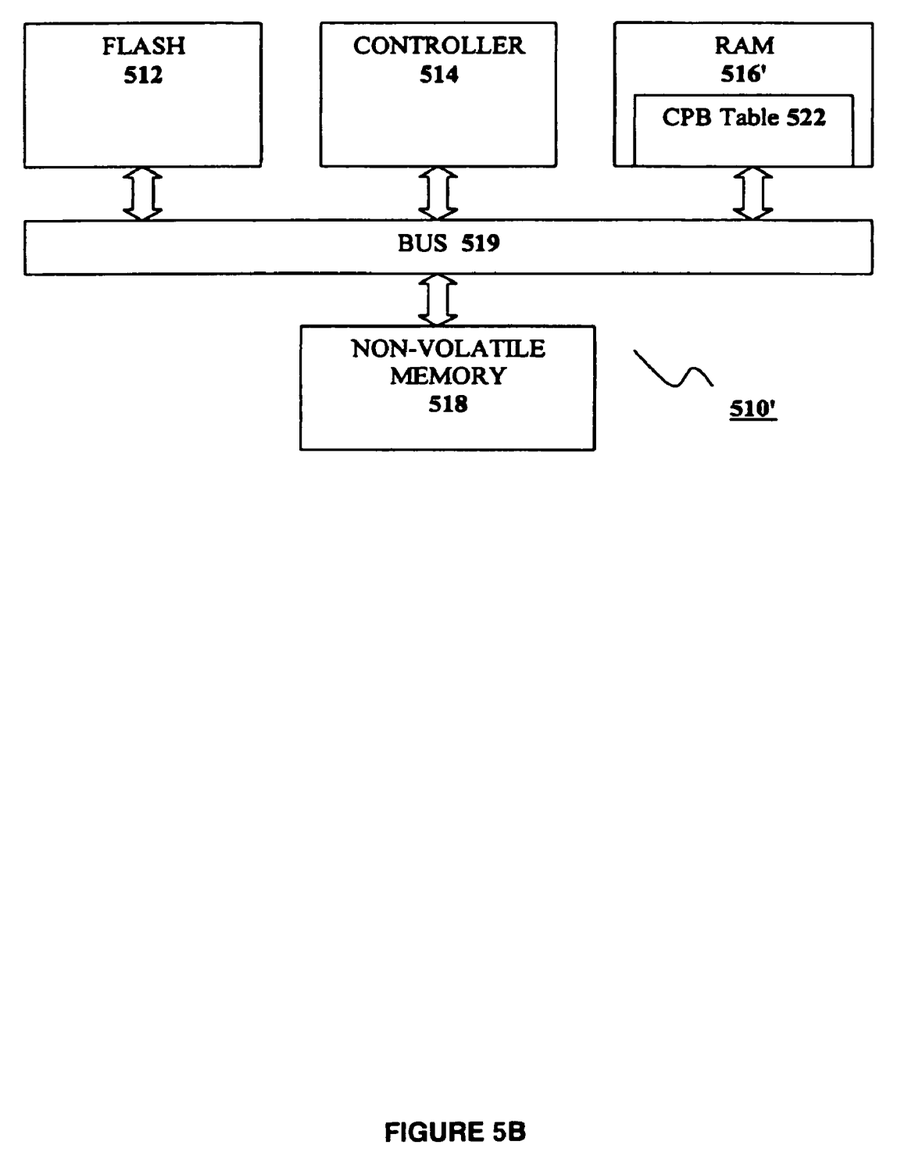

FIG. 5a is a high-level schematic block diagram of a flash-based storage device 510 of the present invention that, like prior art device 10 of FIG. 1a, is used by a host device (not shown) for storing data in one or more NAND flash media (flash memory) 512. The operation of device 510 is controlled by a microprocessor-based controller 514 with the help of a RAM 516 and an auxiliary non-volatile memory 518. For this purpose, flash device 510 and the host system communicate via a communication port 520 in flash device 510. The components of device 510 are housed together in a common housing 415. Unlike RAM 16 in device 10, RAM 516 stores Table 522, which functions as described above.

Controller 514 manages memory 512 as taught for example in U.S. Pat. No. 5,937,425 to Ban, which patent also is incorporated by reference for all purposes as if fully set forth herein. Controller 514 exchanges data stored in memory 512 with the host device in the conventional manner. If device 510 is a portable storage device that is reversibly attached to a host using a suitable interface (e.g. coupled to port 520), for example the USB interface taught in U.S. Pat. No. 6,148,354, to Ban et al., then controller 514 communicates with the host via that interface.

Controller 510 writes data received from the host to memory 512 in the manner of the present invention. That is, in writing to a block of memory 512, the flash management algorithm in controller 510 performs the sequence of operations described above with respect to either refresh-on-demand or pro-active refreshing, in order to write data only into a block erased since a last power-up.

FIG. 5B is a high-level partial schematic block diagram of a personal computer 510', similar to prior art PC 10' of FIG. 1b, in which NAND flash media 512 are used in addition to, or as a substitute for, a magnetic hard disk for long-term non-volatile data storage. Controller 514 now represents the central processing unit (CPU or simply "processor") of personal computer 510'. Auxiliary memory 518 now represents all of the other non-volatile memories of personal computer 510', including a BIOS in which boot code is stored and a magnetic hard disk for storing the operating system, including the flash management system, of personal computer 510' (unless NAND flash media 512 are a substitute for a magnetic hard disk, in which case the operating system is stored in NAND flash media 512). A RAM 516' stores a Table 522, as in device 510 above and unlike RAM 116' in the system of FIG. 1b. NAND flash media 512, controller 514, RAM 516', auxiliary non-volatile memory 518 and other components (not shown) of PC 510' communicate with each other via a bus 519.

The flash management software stored in auxiliary non-volatile memory 518 or in NAND flash media 512 as part of the operating system code of personal computer 510' and executed by controller 514, includes code for implementing the flash management methods of the present invention to ensure that data is written only into physical blocks that have been erased since the last power-up Auxiliary non-volatile memories 518 of devices 510 and 510' (and NAND flash media 512 of device 510' in the embodiment of device 510' in which the operating system is stored in NAND flash media 512) are examples of computer-readable storage media in which is embodied computer-readable code for implementing the method of the present invention.

In summary, the essence of the present invention is total assurance that data is only written to pages that belong to blocks that have been erased since the last power-up.

The method ensures that there is absolutely no attempt to write to a page that may have been partially written. In the first embodiment above, blocks are cleansed "on-write demand", whereas in the second embodiment blocks are cleansed pro-actively, even if they are not needed for writing. The two embodiments are better understood and compared using the following table:

| Embodiment | Refreshing Trigger | Advantage |
| --- | --- | --- |
| On demand refreshing | Upon writing to a non cleansed page | Efficient - no unnecessary refreshing is performed. |
| Pro-active refreshing | Routine sequential refreshing Upon writing to a block beyond the refresh progress | Fast - many blocks are refreshed in advance of their use. |

In both embodiments, the system writes only to pages that have been erased since the last power-up operation, no matter what their situation was prior to the power-down operation.

The scope of the present invention includes the method for writing into a flash memory, which can also be viewed as a flash memory management method, described above. The scope of the present invention also includes a memory system comprising a flash memory and a controller for the memory employing this flash memory management method. The scope of the present invention also includes a computing system comprising a memory system employing this flash memory management method. The scope of the present invention also includes a computing system comprising a memory and a host computer employing this flash memory management method, where no dedicated memory controller is used. The scope of the present invention also includes a computer-readable storage medium bearing code for implementing this flash memory management method.

Note that the method of the present invention is not limited to a particular flash management algorithm, many of which are known in the art. The flash management software running such an algorithm may be implemented either within a dedicated memory controller that is part of the memory device, or within a host computer that attaches directly to the memory (with no intervening controller) and runs software that manages the memory.

All patents and patent applications mentioned in this specification are herein incorporated in their entirety by reference into the specification, to the same extent as if each individual publication, patent or patent application was specifically and individually indicated to be incorporated herein by reference.

While the invention has been described with respect to a limited number of embodiments, it will be appreciated that many variations, modifications and other applications of the invention may be made. Those skilled in the art will appreciate that the invention can be embodied by other forms and ways, without losing the scope of the invention. The embodiments described herein should be considered as illustrative and not restrictive. For example, it should be noted that while this description referred to solving the problem of power failure during a write process, it also applies to the problem of power failure during an erase process, where there is no simple way to know if the block has been properly erased or not, and one cannot rely on the content of the block in making that judgment. This application should be taken to apply to both uncertain situations—power failure during writing into a block, and power failure during erasing a bloc.

What is claimed is:

1. A method for writing into a flash memory device comprising the steps of:
    a. receiving data to be written into the device;
    b. selecting a physical block for writing the data thereto;
    c. obtaining an indication whether the selected physical block has been erased since a last power-up of the device; and
    d. if the indication is that the selected physical block has been erased since the last power-up, writing the data into the selected physical block.

2. The method of claim 1, wherein, if the indication is that the selected physical block has not been erased since last power-up, the step of writing the data into the selected physical block is replaced by the steps of:
    e. obtaining a physical block that was erased since last power-up; and
    f. writing the data into the physical block that was erased since last power-up.

3. The method of claim 2, wherein the physical block that was erased since last power-up has an address that is identical to an address of the selected physical block.

4. The method of claim 2, wherein the physical block that was erased since last power-up is different from the selected physical block.

5. The method of claim 2, wherein the steps of receiving data, selecting a physical block, obtaining an indication, obtaining a physical block and writing the data are controlled by a controller internal to the flash memory device.

6. The method of claim 2, wherein the steps of receiving data, selecting a physical block, obtaining an indication, obtaining a physical block and writing the data are controlled by a controller external to the flash memory device.

7. The method of claim 1 further comprising a step of proactively refreshing logical blocks of the flash memory device.

8. The method of claim 1, wherein the step of obtaining an indication includes obtaining an indication from an entry representing the selected physical block in a table.

9. The method of claim 8, further comprising a step of resetting the table upon power-up to indicate that no physical block has been erased since last power-up.

10. The method of claim 1, wherein the steps of receiving data, selecting a physical block, obtaining an indication and writing the data are controlled by a controller internal to the flash memory device.

11. The method of claim 1, wherein the steps of receiving data, selecting a physical block, obtaining an indication and writing the data are controlled by a controller external to the flash memory device.

12. A method for writing into a flash memory device comprising the steps of:
    a. selecting a physical block for writing data thereto;
    b. obtaining an indication whether the selected physical block has been erased since a last power-up of the device; and
    c. if the indication is that the selected physical block has been erased since the last power-up, writing the data into the selected physical block; or
    d. if the indication is that the selected physical block has not been erased since last power-up, obtaining a physical block that was erased since last power-up and writing the data into the obtained physical block.

13. The method of claim 12, wherein the physical block that was erased since last power-up has an address that is identical to an address of the selected physical block.

14. The method of claim 12, wherein the physical block that was erased since last power-up is different from the selected physical block.

15. A memory device for storing data, comprising:
    a. a flash memory that includes a plurality of physical blocks; and
    b. a controller operative to:
        i. select a physical block for writing data thereto;
        ii. obtain an indication whether the selected physical block has been erased since a last power-up of the device; and
        iii. if the indication is that the selected physical block has been erased since the last power-up, write the data into the selected physical block, or,
        iv. if the indication is that the selected physical block has not been erased since last power-up, obtain a physical block that was erased since last power-up and write the data into the physical block that was erased since last power-up.

16. The memory device of claim 15, further comprising a random access memory coupled to the controller and operative to provide the indication.

17. The memory device of claim 16, wherein the indication is derived from an entry representing the selected physical block in a table stored in the random access memory.

18. A system for storing data, comprising:
    a. a memory device that includes a flash memory having a plurality of physical blocks; and
    b. a processor operative to:
        i. select a physical block for writing data thereto;
        ii. obtain an indication whether the selected physical block has been erased since a last power-up of the device; and
        iii. if the indication is that the selected physical block has been erased since the last power-up, write the data into the selected physical block, or,
        iv. if the indication is that the selected physical block has not been erased since last power-up, obtain a physical block that was erased since last power-up and write the data into the physical block that was erased since last power-up.

19. The system of claim 18, further comprising a random access memory coupled to the processor and operative to provide the indication.

20. The system of claim 19, wherein the indication is derived from an entry representing the selected physical block in a table stored in the random access memory.

21. A computer readable storage medium having computer readable code embodied thereon, the computer readable code for managing a flash memory having a plurality of physical blocks, the computer readable code comprising:

a. program code for selecting a physical block for writing data thereto;

b. program code for obtaining an indication whether the selected physical block has been erased since a last power-up of the device; and c. program code for writing the data into the selected physical block if the indication is that the selected physical block has been erased since the last power-up and for obtaining a physical block that was erased since last power-up and writing the data into the physical block that was erased since last power-up if the indication is that the selected physical block has not been erased since last power-up.

* * * * *